United States Patent
Zhu

(10) Patent No.: US 8,198,153 B2
(45) Date of Patent: Jun. 12, 2012

(54) PROCESS INTEGRATION FOR FLASH STORAGE ELEMENT AND DUAL CONDUCTOR COMPLEMENTARY MOSFETS

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 12/880,180

(22) Filed: Sep. 13, 2010

(65) Prior Publication Data

US 2011/0014757 A1 Jan. 20, 2011

Related U.S. Application Data

(62) Division of application No. 12/110,753, filed on Apr. 28, 2008, now abandoned.

(51) Int. Cl.
*H01L 21/8238* (2006.01)
(52) U.S. Cl. .................................. 438/211; 257/315
(58) Field of Classification Search ................ None
See application file for complete search history.

(56) References Cited

U.S. PATENT DOCUMENTS

| | | |
|---|---|---|
| 2002/0041000 A1 | 4/2002 | Watanabe et al. |
| 2002/0106858 A1 | 8/2002 | Zheng et al. |
| 2002/0149050 A1 * | 10/2002 | Fazio et al. ............... 257/314 |
| 2005/0055494 A1 | 3/2005 | Doris et al. |
| 2005/0169054 A1 * | 8/2005 | Forbes ................. 365/185.08 |
| 2007/0013413 A1 | 1/2007 | Chiang et al. |
| 2007/0057307 A1 | 3/2007 | Shum et al. |
| 2007/0228480 A1 * | 10/2007 | Yen et al. ................. 257/369 |
| 2007/0249131 A1 | 10/2007 | Allen et al. |
| 2007/0272975 A1 | 11/2007 | Schaeffer et al. |
| 2007/0278590 A1 | 12/2007 | Zhu et al. |
| 2008/0076242 A1 * | 3/2008 | Choi et al. ................. 438/588 |
| 2009/0039410 A1 * | 2/2009 | Liu et al. ................... 257/320 |

* cited by examiner

*Primary Examiner* — Long Tran
*Assistant Examiner* — Vongsavanh Sengdara
(74) *Attorney, Agent, or Firm* — Daryl K. Neff; H. Daniel Schnurmann

(57) ABSTRACT

A method is provided for simultaneously fabricating a flash storage element, an NFET and a PFET having metal gates with different workfunctions. A first gate metal layer of the NFET having a first workfunction can be deposited simultaneously with a first metal layer for forming the floating gate of the flash storage element. A second gate metal layer of the PFET having a second workfunction different from the first workfunction can be deposited simultaneously with a second metal layer for forming the control gate of the flash storage element. A semiconductor layer can then be deposited over the first and second metal layers and gate metal layers and patterned to form first, second and third gates. Source and drain regions of the flash storage element, the NFET and the PFET can then be formed adjacent to the first, second and third gates, respectively.

18 Claims, 7 Drawing Sheets

US 8,198,153 B2

PROCESS INTEGRATION FOR FLASH STORAGE ELEMENT AND DUAL CONDUCTOR COMPLEMENTARY MOSFETS

CROSS-REFERENCE TO RELATED APPLICATION

This application is a Division of U.S. application Ser. No. 12/110,753 filed Apr. 28, 2008, the disclosure of which is incorporated herein by reference.

BACKGROUND OF THE INVENTION

1. Field of the Invention

The present invention relates to semiconductor devices and their manufacture, and more specifically to a structure and process integration for a flash storage element and dual conductor complementary field effect transistors.

2. Description of the Related Art

Electrically blowable fuses can be incorporated in very large scale integration ("VSLI") integrated circuits, i.e., semiconductor chips having a multiplicity of conductively interconnected transistors thereon. Such fuses typically store state information used to program circuit functions of the integrated circuit. FIGS. 1A-B illustrates an electrically blowable fuse 10 of a type which is commonly provided within VLSI integrated circuits. Fuse 10 is blown when a sufficiently high programming current is caused to flow across a narrow "fuse link" of conductive material between the anode and the cathode. When the programming current is applied to the fuse, electromigration causes the more highly conductive silicide material of the fuse link to retreat away from the less conductive underlying polycrystalline (Poly-Si) silicon region. After programming, the electrically blowable fuse is in a highly resistive state which can be detected by a circuit associated with the fuse.

One advantage of the electrically blowable fuse 10 is that it has a structure similar to a gate of a field effect transistor ("FET"). Fuse 10 can be fabricated simultaneously with the FETs of an integrated circuit without requiring separate masks and without requiring separate processing steps to be performed to form the fuse.

The structure of the electrically blowable fuse 10 is similar to a traditional gate of a FET in that it has a semiconductor region "Poly-Si" at the lower major surface 12 of the fuse 10 in contact with an underlying dielectric region "STI-Oxide". However, the electrically blowable fuse 10 has a very different structure from a metal gate of an FET. In a metal gate, a metal layer extends along the lower major surface of the gate in contact with the gate dielectric. If the metal layer were incorporated in the electrically blowable fuse 10, the fuse would not function because such metal layer would remain in place after programming and would remain conductive. Accordingly, there is no conventional process for simultaneously fabricating electrically blowable fuses and metal-gated FETs without requiring separate processing steps to form the fuses.

SUMMARY OF THE INVENTION

In view of the foregoing, it would be desirable to provide a structure and method for simultaneously fabricating an electrically alterable element with metal gate FETs on a semiconductor chip in which such element can be used to nonvolatilely store state information.

In accordance with an aspect of the invention, a method is provided for simultaneously fabricating a flash storage element, an NFET and a PFET having metal gates with different workfunctions. A first gate metal layer of the NFET having a first workfunction can be deposited simultaneously with a first metal layer for forming the floating gate of the flash storage element. A second gate metal layer of the PFET having a second workfunction different from the first workfunction can be deposited simultaneously with a second metal layer for forming the control gate of the flash storage element. A semiconductor layer can be deposited over the first and second metal layers and gate metal layers and patterned to form first, second and third gates. Source and drain regions of the flash storage element, the NFET and the PFET can be formed adjacent to the first, second and third gates, respectively.

In accordance with an aspect of the invention, a method is provided for simultaneously fabricating a flash storage element, an n-type field effect transistor (FET) and a p-type FET of a semiconductor element. A first gate dielectric can be deposited followed by deposition of a first gate metal layer overlying the first gate dielectric. The first gate metal layer can be patterned with the first gate dielectric to overlie first and second active semiconductor areas of a substrate but not overlie a third active semiconductor area of the substrate. A second gate dielectric can then be deposited and then a second gate metal layer deposited to overlie the second gate dielectric. The second gate metal layer can be patterned with the second gate dielectric to overlie the first and third active semiconductor areas but not overlie the second active semiconductor area. First, second and third gates overlying the first, second and third active semiconductor areas, respectively, can be formed simultaneously by processing including depositing and patterning a semiconductor layer. Source and drain regions of the flash storage element, the n-type FET and the p-type FET can then be formed in the first, second and third active semiconductor areas, respectively.

In accordance with an aspect of the invention, a method is provided for simultaneously fabricating a flash storage element, an n-type field effect transistor (FET) and a p-type FET of a semiconductor element. The method can include depositing a first gate dielectric and a first gate metal layer overlying the first gate dielectric, and patterning the first gate metal layer to overlie first and second active semiconductor areas of a substrate but not overlie a third active semiconductor area of the substrate. The method can further include depositing a second gate dielectric and a second gate metal layer and patterning the second gate metal layer to overlie the first and third active semiconductor areas but not overlie the second active semiconductor area. First, second and third gates overlying the first, second and third active semiconductor areas, respectively, can then be formed by processing including depositing and patterning a semiconductor layer. Source and drain regions of the flash storage element, the n-type FET and the p-type FET can then be formed in the first, second and third active semiconductor areas, respectively.

DETAILED DESCRIPTION

Figure 1B:
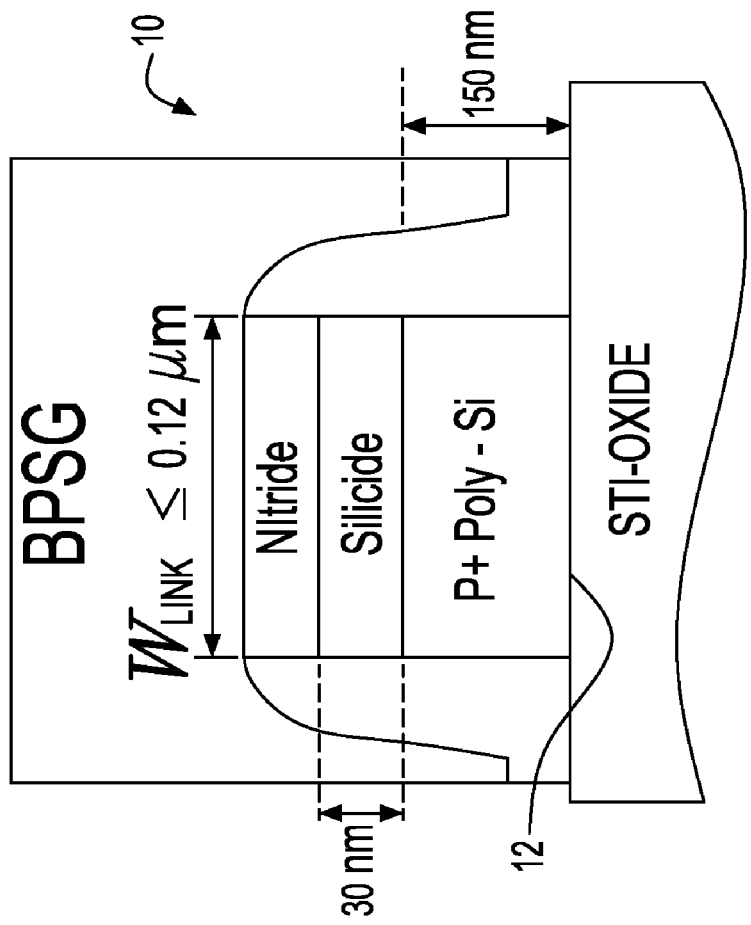
FIGS. 1A-1B are a plan view and a corresponding sectional view illustrating an electrical fuse in accordance with the prior art.
Figure 1A:
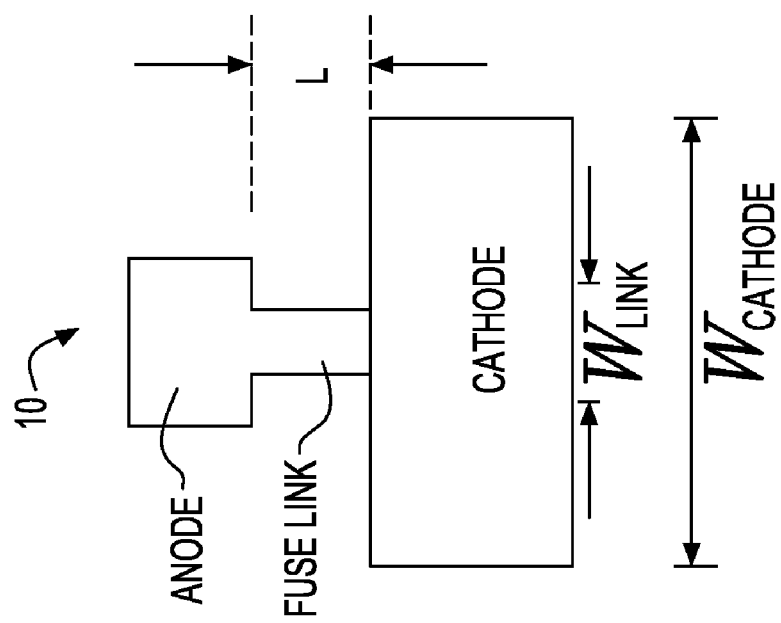
Figure 2A:
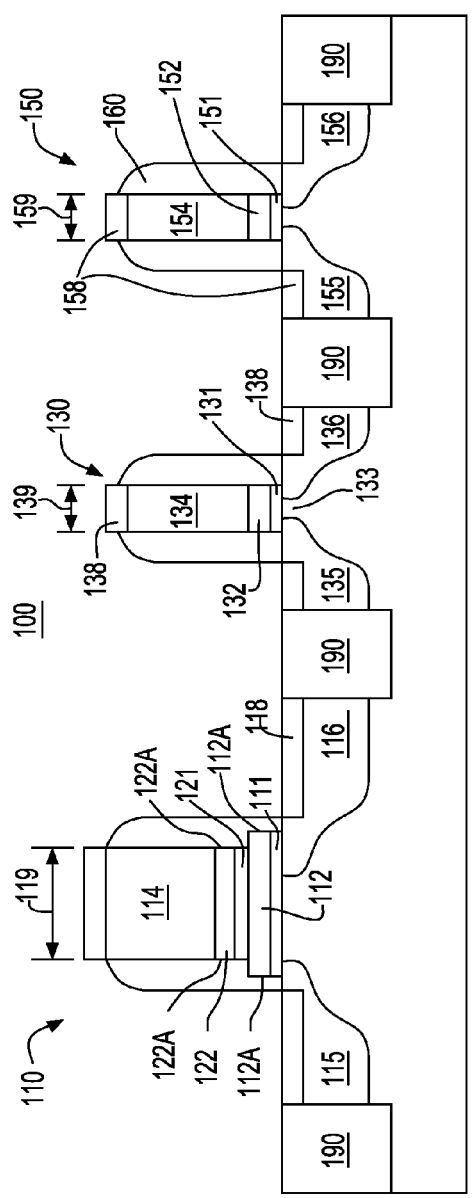
FIGS. 2A and 2B are a cross-sectional view and a corresponding plan view, respectively, illustrating a semiconductor element in accordance with an embodiment of the invention.
Figure 2B:
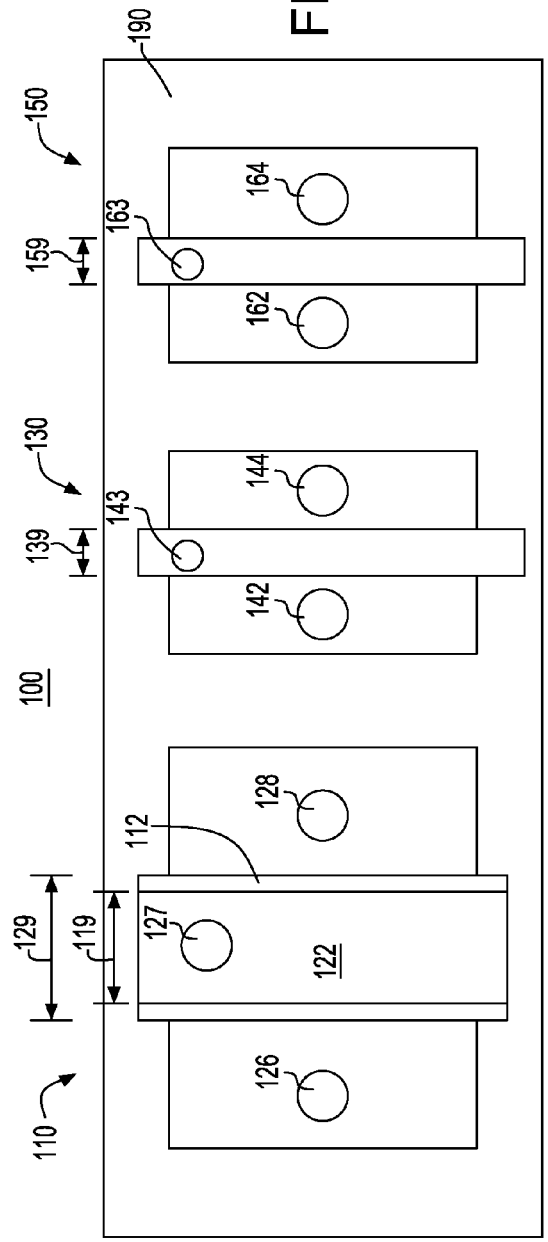

In accordance with an embodiment of the invention, a flash storage element is used to provide a function that was performed by the electrically blowable fuse of the prior art. A flash storage element or "flash cell" 110 is depicted in FIGS. 2A and 2B as part of a semiconductor element 100, e.g., a microelectronic element 100. The flash storage element can be a free-standing device or be incorporated within a bank of a flash memory array within the semiconductor element. Hereinafter, the terms "flash storage element" and "flash cell" are used interchangeably to denote such free-standing or array element unless otherwise noted. The VLSI integrated circuit including the flash storage element is incorporated in a semiconductor chip and typically packaged together with other devices and circuitry (not shown) for external interconnection with a circuit panel or with other chips within a higher-level microelectronic assembly.

The flash storage element 110 maintains a state representing at least one bit of information, i.e., a binary state of either "0" or "1", as determined by the amount of charge present or not present within a floating gate 112 of the element. The charge within the floating gate is acquired through hot injection or tunneling of electrons through an intermediate gate dielectric 121 from an overlying control gate. The relative electrical isolation of the floating gate makes the hot injected or tunneling electron charges persist for a very long time. This makes the flash storage element nonvolatile in that the state remains stored therein even if power is completely removed from the flash storage element for long periods of time, i.e., days, months or even years. The state of the flash storage element is read by applying a relatively low "read" voltage to a control gate 114 of the flash storage element and determining the resistance between a source region 115 and a drain region 116 of the device. Low resistance indicates one binary state; high resistance indicates another state.

The state of the flash storage element remains the same until the flash storage element is programmed, even if power is removed therefrom. When a voltage is applied to the flash storage element at a write level sufficiently higher than the read-level voltage, the flash storage element can be programmed to a different state from that previously maintained. The flash storage element then maintains the programmed state unless and until it is programmed to a different state again. Some flash storage elements can be programmed to store more than binary state in a single storage element; e.g., such as a state of a "0", "1" or "2" in a tertiary scheme, depending upon the resistance level detected when reading the flash storage element. Some flash storage elements can be programmed to store a quaternary state, e.g., a state of a "0", "1", "2" or "3". For the purposes of the following description, the number of different state levels stored by the flash storage element is not important, as the principles of fabrication and structure of the flash storage element are generally the same in each case.

As further illustrated in FIGS. 2A and 2B, the semiconductor element 100 further includes an n-type field effect transistor ("NFET") 130 and a p-type field effect transistor ("PFET") 150. The flash storage element 110 and the NFET and PFET are separated from each other by one or more isolation regions 190. Isolation regions can be trench isolation regions, for example, which can formed by etching trenches into the semiconductor substrate and then depositing a dielectric material within the trenches. The NFET has a first metal gate. By "metal gate" is meant a gate which includes a "metal layer" 132 consisting essentially of one or more of a metal or a conductive compound in contact with the gate dielectric which is sufficiently thick to store a charge within the metal layer for generating an inversion layer within the channel 133 of the FET. Due to eliminating poly-gate depletion, using a metal gate can improve performance by increasing switching speed and current density of MOSFETs. The gate can but need not consist entirely of the metal layer. The gate of the NFET illustrated in FIG. 2A includes a layer 134 of polycrystalline semiconductor material such as polysilicon overlying the metal layer 132. The metal layer 132 has a workfunction suited to the operation of the NFET. Specifically, the metal layer of the NFET can include or consist essentially of one or more of a metal or a conductive compound of a metal which has a workfunction that is close to an edge of the conductive band, especially for a high performance NFET. In one illustrative example, the metal layer 132 of the NFET consists essentially of tantalum nitride (TaN).

Use of a metal gate can also facilitate use of certain high-performance gate dielectric materials which have high permeability, i.e., high dielectric constant, such as a variety of materials including ferroelectric dielectric materials, perovskite materials, etc., among which are silicon nitride having a dielectric constant of about 7.5 and hafnium oxide and barium strontium titanate which have even higher dielectric constants. Such high dielectric constant materials, which have dielectric constants substantially greater than the dielectric constant (approximately 3.9) of silicon dioxide can help increase switching speed and current density within the transistor. Here, in one embodiment, the gate dielectric 131 of the NFET includes a high dielectric constant material such as hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$) and mixtures thereof.

The NFET further includes a source region 135 and a drain region 136 separated from the source region by the metal layer 132 of the gate. Optionally, silicide regions 138 can be provided at exposed surfaces of the gate semiconductor layer 134 and the source and drain regions 135, 136.

The PFET 150 has a structure similar to the NFET, having a source region 155, a drain region 156, a gate dielectric layer 151, a gate which includes a polycrystalline semiconductor layer 154 and optional silicide regions 158. However, the gate of the PFET has a metal layer 152 which has a different workfunction from the metal layer 132 of the NFET. The metal layer 152 of the PFET includes or consists essentially of one or more of a metal or conductive compound of a metal which has a workfunction that is close to an edge of the valance band, especially for a high performance PFET. Illustratively, the metal layer 152 of the PFET can consist essentially of titanium nitride (TiN). Similar to the NFET, in one embodiment, the gate dielectric 131 of the PFET can include a high dielectric constant material such as hafnium oxide ($HfO_2$), zirconium oxide ($ZrO_2$), aluminum oxide ($Al_2O_3$), titanium oxide ($TiO_2$), lanthanum oxide ($La_2O_3$), strontium titanate ($SrTiO_3$), lanthanum aluminate ($LaAlO_3$) and mixtures thereof.

As further illustrated in FIG. 2B, conductive vias 142, 143 and 144 connected to the source, gate and drain of the NFET, respectively, connect the NFET to other devices on the chip; similar conductive vias 162, 163 and 164 connected to the source, gate and drain of the PFET, respectively, connect the PFET to other devices on the chip, which may include the NFET 130, the flash cell 110, or both.

In order for the metal layer 152 of the PFET to have a different workfunction from the metal layer 132 of the NFET, the metal layers 132, 152 must include different materials and must be formed by separate depositions. As will be apparent from the following description, the floating gate and control gate of the flash storage element 110 can be formed by the same processing used to form the gates of the NFET and PFET. This is because the primary gate dielectric 111 of the flash cell 110 is patterned from a portion of a single deposited dielectric layer from which both the gate dielectric 111 and the gate dielectric 131 of the NFET are patterned. Therefore, in one embodiment, the gate dielectric 111 and gate dielectric 131 are both a high dielectric constant material such as HfO2. In addition, the floating gate 112 of the flash cell is patterned from a portion of a single deposited metal layer from which both the floating gate 112 and the metal layer 132 of the NFET are patterned. Similarly, the second gate dielectric 121 between the floating gate and the control gate is patterned from a portion of the same dielectric layer from which both the second gate dielectric and the gate dielectric 151 of the PFET are patterned. In one embodiment, the gate dielectric 121 and gate dielectric 151 are both a high dielectric constant material such as HfO2. On the other hand, the material of which gate dielectrics 121 and 151 essentially consists can be different from the material of which the gate dielectrics 111 and 131 essentially consist.

The metal layer 122 of the control gate 112 can be patterned from a single deposited metal layer from which the metal layer 122 and the metal layer 152 of the PFET are patterned. Similarly, the gate semiconductor layer 114 of the flash cell is patterned from a single deposited semiconductor layer from which that layer 114 and the gate semiconductor layer 154 of the PFET are patterned. Accordingly, the flash cell can be fabricated on the semiconductor element at little or no additional processing cost in terms of deposition steps and masks.

Other features of the flash cell 110 are further illustrated in FIGS. 2A-B. For example, the flash cell 110 typically includes silicide regions 118 at exposed surfaces of the control gate and source and drain regions, similar to the silicide regions 138 and 158 of the NFET and PFET, respectively. The length 119 of the control gate can be less than the length 129 of the floating gate. Use of fabrication method described below can result in a control gate having a shorter length 119 than the length 129 of the floating gate. Optionally, the length 119 of the control gate of the flash cell can be greater and can be substantially greater than the lengths 139, 159 of the gates of the NFET and the PFET, respectively. Conductive vias 126, 127 and 128 (FIG. 2B) are also connected to the source, gate and drain of the flash cell 110.

Another feature of the flash cell depicted in FIGS. 2A-B is that locations of the edges 122A of the control gate can be independent from the locations of the edges 112A of the floating gate. Stated another way, the locations of the edges 122A of the control gate need not be determined directly by the locations of the edges 112A of the floating gate. In accordance with the fabrication method described below, the control gate can be patterned lithographically using a separate masking step from that used to pattern the floating gate, such that the relative edge locations are independent and can vary with respect to each other. Another way that the edge locations of the control gate and the floating gate can be described is that their edge locations are "not self-aligned". Specifically, the edge locations of the control gate and the floating gate can be misaligned to the extent of overlay tolerance between the separate masks used to form the gates.

Figure 3:
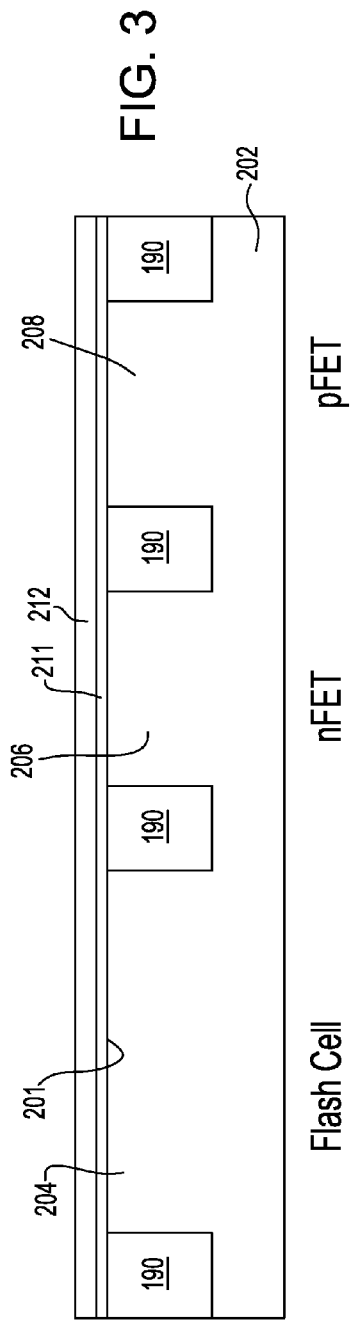
FIG. 3 is a sectional view depicting a semiconductor substrate having a first gate dielectric and first metal layer thereon in a preliminary stage in fabrication of a semiconductor element according to an embodiment of the invention.

A method of fabricating the semiconductor element 100 (FIGS. 2A-B) will now be described with reference to FIGS. 3 through 11. The reference markings "Flash Cell", "NFET" and "PFET" in FIGS. 3 through 11 are indicative of areas of the substrate where these devices will be formed. Referring to FIG. 3, trench isolation regions 190 are formed within a single-crystal semiconductor region 202 of a substrate to define first, second and third active semiconductor areas 204, 206 and 208. The semiconductor region can itself be a bulk semiconductor region of the substrate or, alternatively in a semiconductor-on-insulator ("SOI") implementation, can be a single-crystal semiconductor layer overlying a bulk semiconductor region (not shown), as separated therefrom by a buried dielectric layer (not shown). A first gate dielectric layer 211 and then a first metal layer 212 (consisting essentially of one or more of a metal or a conductive compound of a metal) then are deposited to overlie a major surface 201 of the semiconductor region 202. In one embodiment, the first gate dielectric layer 211 includes a high dielectric constant material, which can be HfO2, for example. In one embodiment, the first metal layer can consist essentially of titanium nitride (TaN). Illustratively, when the gate dielectric material is HfO2, the deposited thickness can range from 0.5 nanometers (5 Angstrom) to 5 nanometers (50 Angstroms). Illustratively, when the metal layer consists essentially of TiN, the deposited thickness can range from 3 nanometers (30 Angstroms) to 40 nanometers (400 Angstroms).

Figure 4:
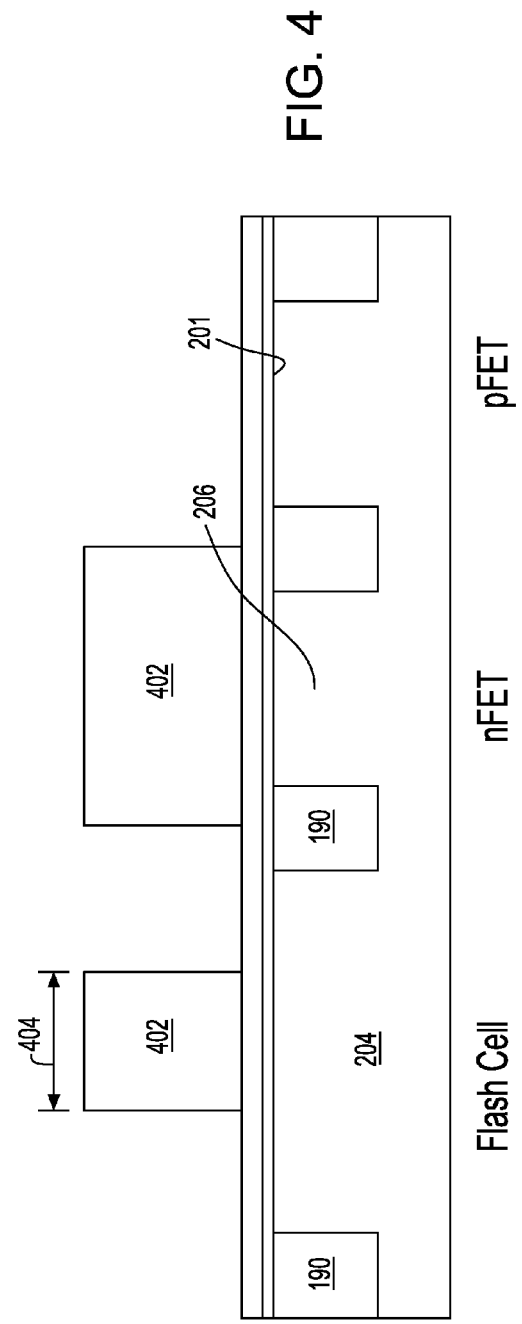
FIGS. 4-5 are sectional views depicting the structure shown in FIG. 3 with addition of a mask and subsequent patterning of the first gate dielectric and first metal layer, respectively.
Figure 5:
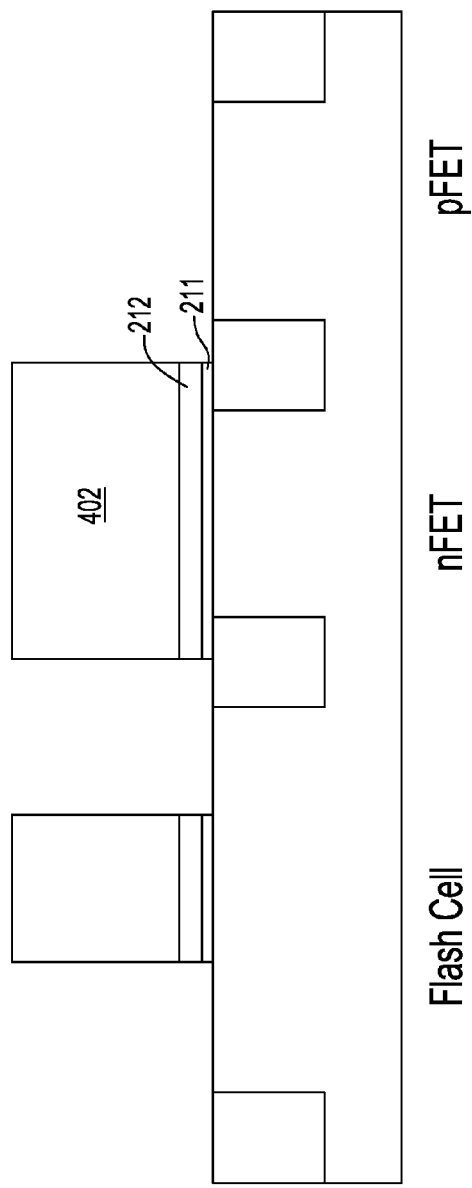

Thereafter, as illustrated in FIG. 4, a photoresist layer is deposited over the major surface 201 and photolithographically patterned to form a photoresist mask 402 covering only a part of the active semiconductor area 204 for the flash cell. As illustrated, the part of the active area 204 covered is spaced from each of the isolation regions 190 in the directions 404 shown. In one embodiment, the resist mask 402 can be centered between the isolation regions 190 in the directions 404 shown. The resist mask 402 will normally cover all of the area of the active semiconductor area 206 for the NFET. Thereafter, as illustrated in FIG. 5, the metal layer 212 and the gate dielectric layer 211 are sequentially patterned by etching, leaving only the portions covered by the mask 402 in place.

Figure 6:
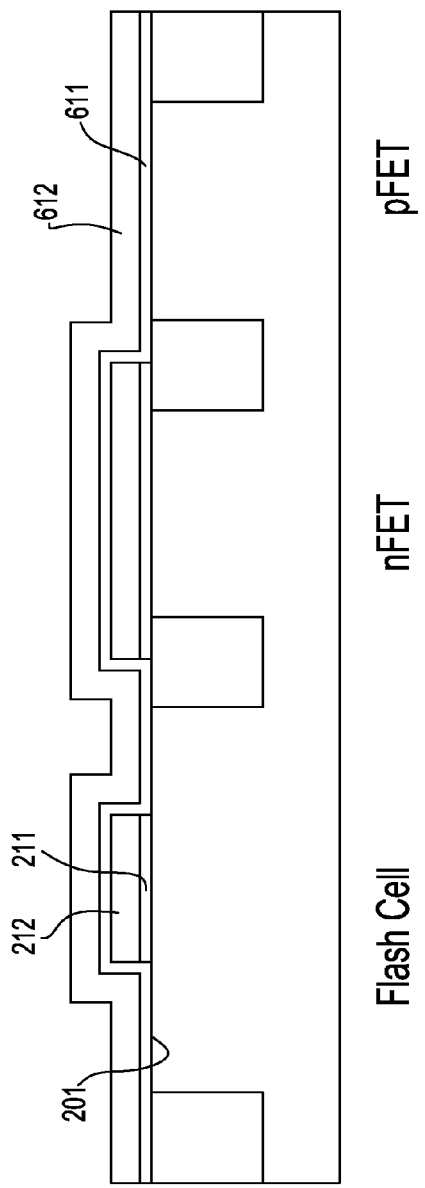
FIG. 6 is a sectional view depicting a stage of fabrication subsequent to that shown in FIG. 5, with addition of a second gate dielectric and second metal layer thereon.

Thereafter, as illustrated in FIG. 6, the resist mask is removed and a second gate dielectric layer 611 and a second metal layer 612 then are sequentially deposited over the major surface 201 of the substrate, these layers 611, 612 covering the earlier patterned gate dielectric layer 211 and metal layer 212. The metal layer can include one or more of a metal or a conductive compound of a metal. In one embodiment, the second gate dielectric layer 611 includes a high dielectric constant material, which can be HfO2, for example. In one embodiment, the second metal layer can consist essentially of titanium nitride (TiN). Illustratively, when the second gate dielectric material is HfO2, the deposited thickness can range from 0.5 nanometers (5 Angstrom) to 5 nanometers (50 Angstroms). Illustratively, when the second metal layer consists essentially of TiN, the deposited thickness can range from 3 nanometers (30 Angstroms) to 40 nanometers (400 Angstroms).

Figure 7:
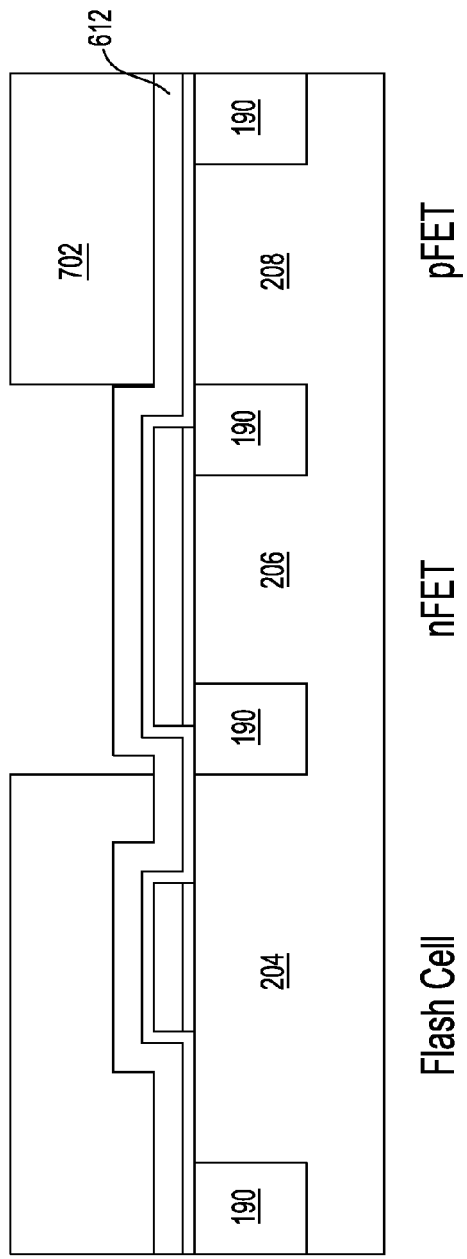
FIGS. 7-8 are sectional views depicting the structure shown in FIG. 6 with addition of a second mask and subsequent patterning of the second gate dielectric and second metal layer, respectively.
Figure 8:
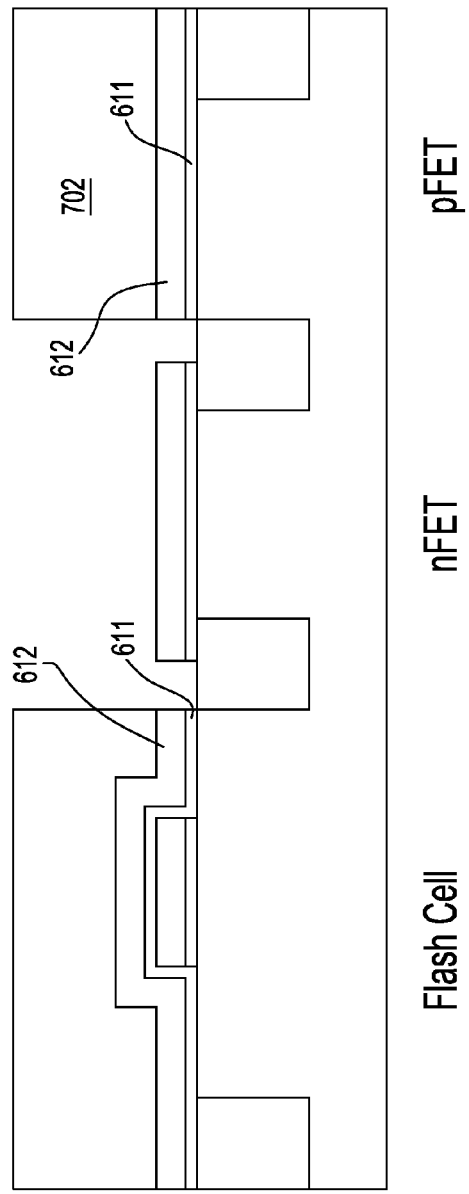

Thereafter, as illustrated in FIG. 7, a photoresist layer is deposited over the major surface 201 and photolithographically patterned to form a photoresist mask 702 covering the active semiconductor area 204 for the flash cell and the active semiconductor area 208 for the PFET. Normally, the resist mask 702 covers all the active semiconductor area 204 for the flash cell and all the active semiconductor area 208 for the PFET. Although not shown, typically, the resist mask overlies at least portions of the trench isolation regions 190 adjacent to each of the covered active semiconductor areas 204, 208. Thereafter, as illustrated in FIG. 8, the second metal layer 612 and the gate dielectric layer 611 are sequentially patterned by etching, leaving only the portions covered by the mask 702 in place.

Figure 9:
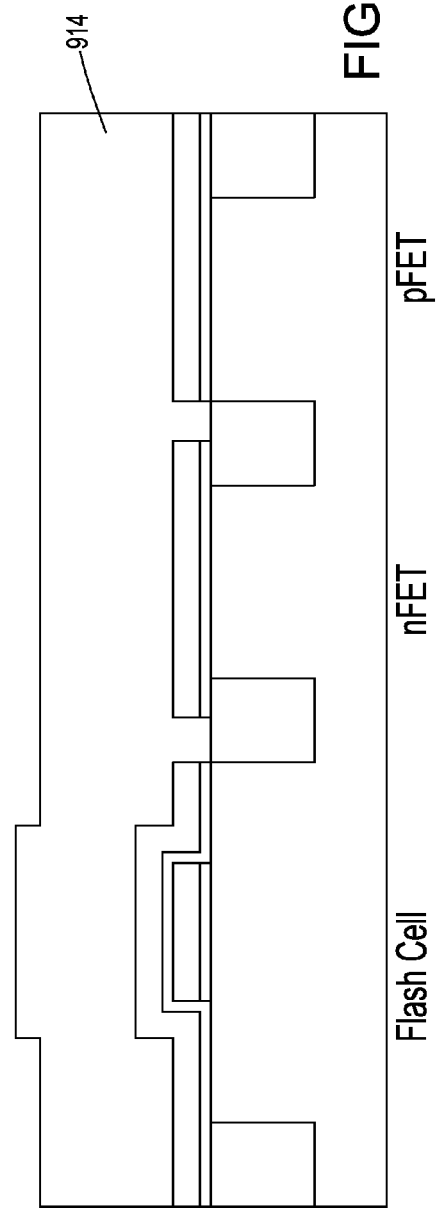
FIG. 9 is a sectional view depicting the structure shown in FIG. 8, after depositing a semiconductor layer over the first and second metal layers.

Subsequently, as illustrated in FIG. 9, the resist mask is removed and then a semiconductor layer 914 is formed overlying the previously formed structure. For example, a layer consisting essentially of polysilicon or other polycrystalline semiconductor or semiconductor alloy, doped or undoped, can be deposited.

Figure 10:
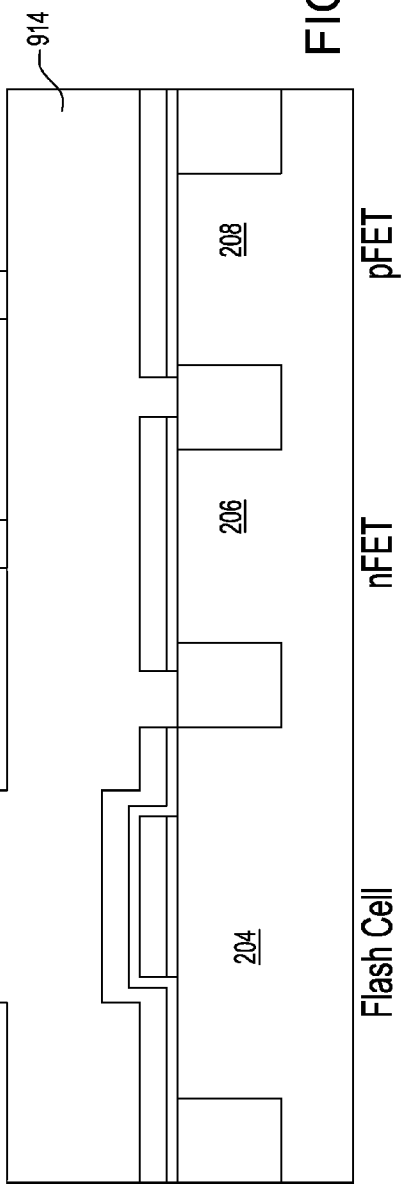
FIGS. 10-11 are sectional views depicting the structure shown in FIG. 9 with addition of a third mask and subsequent patterning of the deposited semiconductor layer, respectively.
Figure 11:
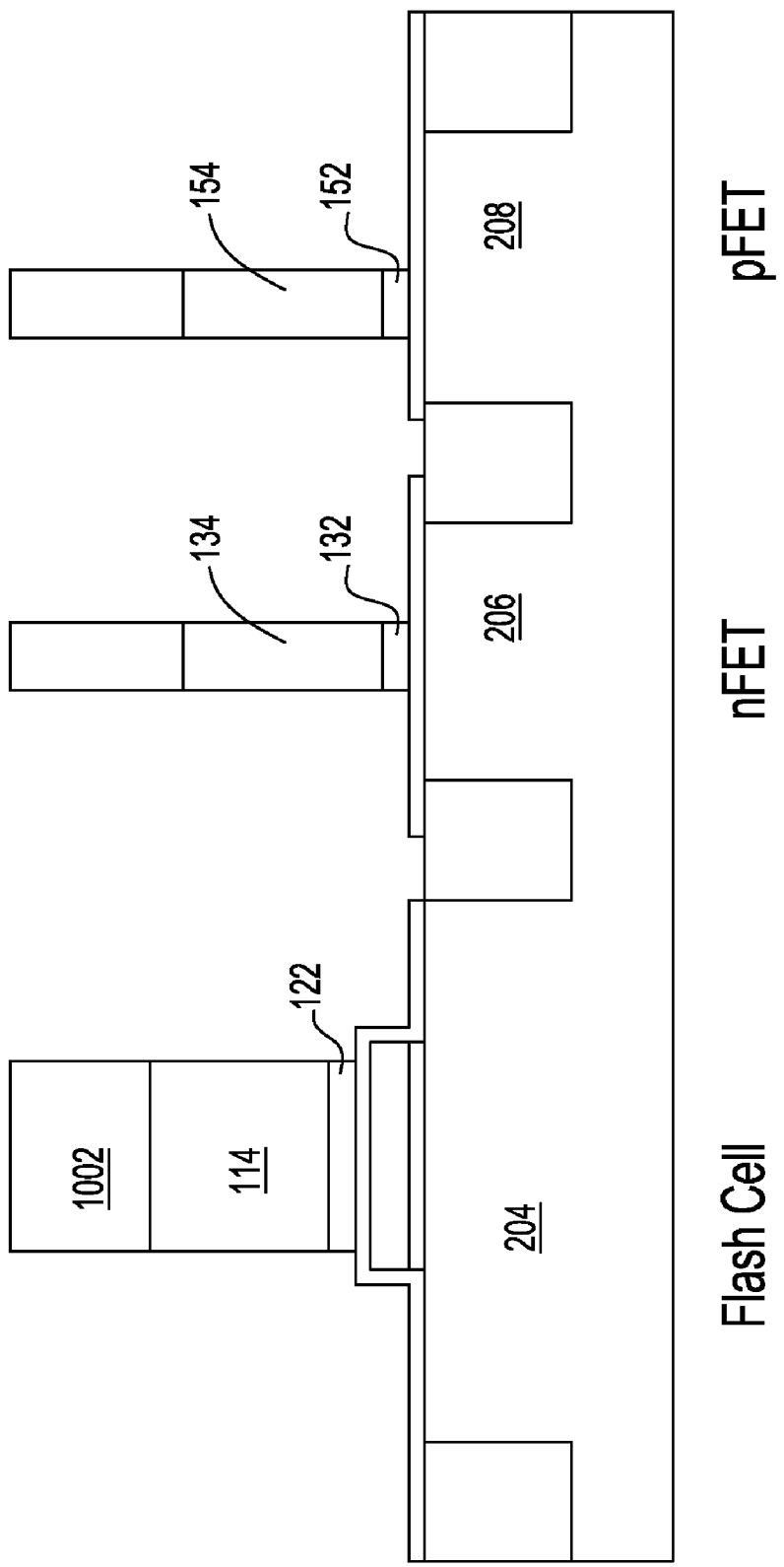

As further illustrated in the sectional view of FIG. 10, a mask layer, e.g., photoresist layer, with or without an optional hard mask layer, is deposited over the semiconductor layer 914 and photolithographically patterned to form mask patterns 1002 extending linearly in a direction into the page in FIG. 10, the patterns being formed over each of the active semiconductor areas 204, 206 and 208. Thereafter, as illustrated in FIG. 11, the semiconductor layer 914 (FIG. then is patterned by etching in accordance with the mask patterns 1002 to form the gate semiconductor layers 114, 134 and 154 of the transistors. Portions of the first and second metal layers which are not directly covered by the second gate dielectric then are patterned by etching in accordance with the mask patterns 1002 to form the metal layers 132 and 152 of the NFET and the PFET, respectively. While etching these metal layers, the metal layer 122 of the control gate also is patterned by etching in accordance with the mask patterns 1002. Etching of the metal layers is performed selectively with respect to the material of the first and second gate dielectric layers such that these layers remain substantially in place and protect the underlying single crystal semiconductor regions 204, 206 and 208 during the etching process.

Portions of the gate dielectric layer exposed beyond edges of the metal layers 122, 132 and 152 then are removed. Thereafter, as illustrated in FIGS. 2A-B, steps are performed to complete the fabrication of the flash cell 110, the NFET 130 and the PFET 150. The dopant profiles of the semiconductor gate layers 114, 135 and 154 and the source and drain regions of each of the flash cell, the NFET and the PFET can be established by several implantation steps. Dielectric spacers 160 can be formed on walls of the gates of the flash cell, the NFET and the PFET as shown. Silicide regions 113, 138 and 158 can be formed, such as by depositing a silicide precursor metal layer and causing portions of such metal layer in contact with the semiconductor gate layers and source and drain regions to react therewith and then removing unreacted portions of the metal layer overlying the dielectric spacers.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of simultaneously fabricating a flash storage element, an n-type field effect transistor (FET) and a p-type FET of a semiconductor element, comprising:
   (a) depositing a first gate dielectric and a first gate metal layer overlying the first gate dielectric and patterning the first gate metal layer with the first gate dielectric to overlie first and second active semiconductor areas of a substrate but not overlie a third active semiconductor area of the substrate;
   (b) depositing a second gate dielectric and a second gate metal layer overlying the second gate dielectric and patterning the second gate metal layer with the second gate dielectric to overlie the first and third active semiconductor areas but not overlie the second active semiconductor area;
   (c) then simultaneously forming first, second and third gates overlying the first, second and third active semiconductor areas, respectively, by processing including depositing and patterning a semiconductor layer; and
   (d) then forming source and drain regions of the flash storage element, the n-type FET and the p-type FET in the first, second and third active semiconductor areas, respectively;
   wherein the flash storage element has a floating gate including a portion of the first gate metal layer and a control gate including a portion of the second gate metal layer, the first and second gate metal layers being separated by the second gate dielectric layer.

2. The method as claimed in claim 1, wherein the gate length of the floating gate is greater than the gate length of the control gate.

3. The method as claimed in 1, wherein the gate length of at least one of the control gate or the floating gate of the flash storage element is greater than the gate length of at least one of the second or third gates.

4. The method as claimed in 1, wherein the first gate metal layer has a first workfunction and the second gate metal layer has a second workfunction substantially different from the first workfunction.

5. The method as claimed in claim 4, wherein the first gate dielectric includes a dielectric layer having a dielectric constant substantially greater than a dielectric constant of silicon dioxide.

6. The method as claimed in claim 5, wherein the first gate dielectric includes at least one dielectric material selected from the group consisting of hafnium oxide (HfO2), zirconium oxide (ZrO2), aluminum oxide (Al2O3), titanium oxide (TiO2), lanthanum oxide (La2O3), strontium titanate (SrTiO3), and lanthanum aluminate (LaAlO3).

7. The method as claimed in claim 5, wherein the second gate dielectric includes a dielectric layer having a dielectric constant substantially greater than a dielectric constant of silicon dioxide.

8. The method as claimed in claim 7, wherein the second gate dielectric includes at least one dielectric material selected from the group consisting of hafnium oxide (HfO2), zirconium oxide (ZrO2), aluminum oxide (Al2O3), titanium oxide (TiO2), lanthanum oxide (La2O3), strontium titanate (SrTiO3), and lanthanum aluminate (LaAlO3).

9. The method as claimed in 1, wherein step (a) determines locations of edges of the floating gate and step (b) determines locations of edges of the control gate independently from the processing in step (a).

10. A method of simultaneously fabricating a flash storage element, an n-type field effect transistor (FET) and a p-type FET of a semiconductor element, comprising:

(a) depositing a first gate dielectric and a first gate metal layer overlying the first gate dielectric and patterning the first gate metal layer to overlie first and second active semiconductor areas of a substrate but not overlie a third active semiconductor area of the substrate;

(b) depositing at least a second gate dielectric and a second gate metal layer and patterning the second gate metal layer to overlie the first and third active semiconductor areas but not overlie the second active semiconductor area;

(c) then forming first, second and third gates overlying the first, second and third active semiconductor areas, respectively, by processing including depositing and patterning a semiconductor layer; and (d) then forming source and drain regions of the flash storage element, source and drain regions of the n-type FET and source and drain regions of the p-type FET in the first, second and third active semiconductor areas, respectively;

wherein the flash storage element has a floating gate including a portion of the first gate metal layer and a control gate including a portion of the second gate metal layer, the first and second gate metal layers being separated by a second gate dielectric layer.

11. The method as claimed in claim 10, wherein the gate length of the floating gate is greater than the gate length of the control gate.

12. The method as claimed in 10, wherein the gate length of at least one of the control gate or the floating gate of the flash storage element is greater than the gate length of at least one of the second or third gates.

13. The method as claimed in 10, wherein the first gate metal layer has a first workfunction and the second gate metal layer has a second workfunction substantially different from the first workfunction.

14. The method as claimed in claim 13, wherein the first gate dielectric includes a dielectric layer having a dielectric constant substantially greater than a dielectric constant of silicon dioxide.

15. The method as claimed in claim 14, wherein the first gate dielectric includes at least one dielectric material selected from the group consisting of hafnium oxide (HfO2), zirconium oxide (ZrO2), aluminum oxide (Al2O3), titanium oxide (TiO2), lanthanum oxide (La2O3), strontium titanate (SrTiO3); and lanthanum aluminate (LaAlO3).

16. The method as claimed in claim 14, wherein the second gate dielectric includes a dielectric layer having a dielectric constant substantially greater than a dielectric constant of silicon dioxide.

17. The method as claimed in claim 16, wherein the second gate dielectric includes at least one dielectric material selected from the group consisting of hafnium oxide (HfO2), zirconium oxide (ZrO2), aluminum oxide (Al2O3), titanium oxide (TiO2), lanthanum oxide (La2O3), strontium titanate (SrTiO3), and lanthanum aluminate (LaAlO3).

18. The method as claimed in 10, wherein step (a) determines locations of edges of the floating gate and step (b) determines locations of edges of the control gate independently from the processing in step (a).

* * * * *